United States Patent
Kuo et al.

(10) Patent No.: US 7,411,836 B2
(45) Date of Patent: Aug. 12, 2008

(54) METHOD OF OPERATING NON-VOLATILE MEMORY

(75) Inventors: Ming-Chang Kuo, Hsinchu (TW); Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 294 days.

(21) Appl. No.: 11/248,698

(22) Filed: Oct. 11, 2005

(65) Prior Publication Data

US 2007/0081394 A1    Apr. 12, 2007

(51) Int. Cl.
*G11C 16/04* (2006.01)
(52) U.S. Cl. ............... 365/185.28; 365/185.01; 365/185.05; 365/185.14; 365/185.18; 257/311; 257/324; 257/E29.303; 257/E29.305
(58) Field of Classification Search ............ 365/185.18, 365/182.29, 185.28; 257/311, 321, 324
See application file for complete search history.

(56) References Cited

U.S. PATENT DOCUMENTS

| | | | |
|---|---|---|---|
| 6,011,725 A | 1/2000 | Eitan | 365/185.33 |
| 7,158,411 B2 * | 1/2007 | Yeh et al. | 365/185.18 |
| 2005/0056884 A1 * | 3/2005 | Osabe et al. | 257/324 |
| 2007/0081393 A1 * | 4/2007 | Lue et al. | 365/185.28 |

OTHER PUBLICATIONS

"Pines: A Novel Low Power Program/Erase, Small Ptich, 2-Bit per Cell flash Memory" By C.C. Yeh et al. / International Electron Devices Meeting, IEEE 2002 / pp. 931-936.

"Analysis of the Enhanced Hot-Electron Injection in Split-Gate Transistors Useful for EEPRM Applications" By Jan Van Houdt et al. / IEEE Transactions on Electron Devices, vol. 39, No. 5, May 1992 / pp. 1150-1156.

* cited by examiner

*Primary Examiner*—Dao H Nguyen
(74) *Attorney, Agent, or Firm*—J.C. Patents

(57) ABSTRACT

A method of operating a non-volatile memory comprising a substrate, a gate, a charge-trapping layer, a source region and a drain region is provided. The charge-trapping layer close to the source region is an auxiliary charge region and the charge-trapping layer close to the drain region is a data storage region. Before prosecuting the operation, electrons have been injected into the auxiliary charge region. When prosecuting the programming operation, a first voltage is applied to the gate, a second voltage is applied to the source region, a third voltage is applied to the drain region and a fourth voltage is applied to the substrate. The first voltage is bigger than the fourth voltage, the third voltage is bigger than the second voltage, and the second voltage is bigger than the fourth voltage to initiate a channel initiated secondary hot electron injection to inject electrons into the data storage region.

15 Claims, 1 Drawing Sheet

METHOD OF OPERATING NON-VOLATILE MEMORY

BACKGROUND OF THE INVENTION

1. Field of the Invention

The present invention relates to a method of operating a memory device. More particularly, the present invention relates to a method of operating a non-volatile memory.

2. Description of the Related Art

Electrically erasable programmable read only memory (EEPROM) is one type of non-volatile memory that permits multiple data input, readout and erasure. Furthermore, input data can still be retained after power supply to the device is removed. Therefore, EEPROM has become one of the mostly widely adopted memory devices for personal computer and electronic equipment.

Typically, each EEPROM cell has a floating gate and a control gate fabricated using doped polysilicon. In the process of programming the memory cell, electrons injected into the floating gate will distribute evenly over the entire polysilicon floating gate layer. However, if the tunneling oxide layer underneath the polysilicon floating gate has some defects, current may leak out from the device causing reliability problems.

To minimize the current leak in the EEPROM device, a conventional method includes replacing the polysilicon floating gate with a charge-trapping layer. The charge-trapping layer is fabricated using silicon nitride, for example. The silicon nitride charge-trapping layer is normally sandwiched between a top silicon oxide layer and a bottom silicon oxide layer to form a stacked gate structure comprising an oxide/nitride/oxide (ONO) composite dielectric layer. An EEPROM having such as stacked gate structure is frequently referred to as a nitride read-only-memory (NROM).

Since the NROM is normally programmed through the injection of hot electrons, a high operating voltage and a high power rating is required. However, as the size of non-volatile memory cells continues to shrink due to miniaturization, the length of the channel must be reduced. Therefore, a high operating voltage will intensify the punch-through effect and result in a higher leakage current and a lower programming efficiency.

SUMMARY OF THE INVENTION

Accordingly, at least one objective of the present invention is to provide a method of operating a non-volatile memory capable of increasing programming efficiency.

To achieve these and other advantages and in accordance with the purpose of the invention, as embodied and broadly described herein, the invention provides a method of operating a non-volatile memory. The non-volatile memory comprises a gate over a substrate, a charge-trapping layer between the gate and the substrate, a source region in the substrate on one side of the gate and a drain region in the substrate on another side of the gate. The charge-trapping layer close to the source region is an auxiliary charge region and the charge-trapping layer close to the drain region is a data storage region. The threshold voltage of auxiliary charge region is about 4~5V and the threshold voltage of data storage region is about 2V. There is an abrupt electrical field between auxiliary charge region and data storage region. Therefore the programming efficiency of the memory is enhanced. Furthermore, electrons have been injected into the auxiliary charge region before prosecuting the operation. To prosecute a programming operation, a first voltage is applied to the gate, a second voltage is applied to the source region, a third voltage is applied to the drain region and a fourth voltage is applied to the substrate. The first voltage is bigger than the fourth voltage, the third voltage is bigger than the second voltage, and the second voltage is bigger than the fourth voltage to initiate a channel initiated secondary hot electron injection (CHISEL) to inject electrons into the data storage region.

According to the aforementioned method of operating the non-volatile memory in one preferred embodiment of the present invention, the first voltage is between 2~7V.

According to the aforementioned method of operating the non-volatile memory in one preferred embodiment of the present invention, the first voltage is between 4~5V.

According to the aforementioned method of operating the non-volatile memory in one preferred embodiment of the present invention, the second voltage is between −2~2V.

According to the aforementioned method of operating the non-volatile memory in one preferred embodiment of the present invention, the second voltage is about 0V.

According to the aforementioned method of operating the non-volatile memory in one preferred embodiment of the present invention, the third voltage is between 3~6V.

According to the aforementioned method of operating the non-volatile memory in one preferred embodiment of the present invention, the third voltage is between 4~5V.

According to the aforementioned method of operating the non-volatile memory in one preferred embodiment of the present invention, the fourth voltage is between 0~−4V.

According to the aforementioned method of operating the non-volatile memory in one preferred embodiment of the present invention, the fourth voltage is between −1~−2V.

According to the aforementioned method of operating the non-volatile memory in one preferred embodiment of the present invention, the charge-trapping layer is fabricated using silicon nitride.

According to the aforementioned method of operating the non-volatile memory in one preferred embodiment of the present invention, the charge-trapping layer includes a composite film layer comprising an insulating layer and a nanometer crystal layer embedded within the insulating layer.

According to the aforementioned method of operating the non-volatile memory in one preferred embodiment of the present invention, the non-volatile memory further includes a first dielectric layer disposed between the substrate and the charge-trapping layer.

According to the aforementioned method of operating the non-volatile memory in one preferred embodiment of the present invention, the material constituting the first dielectric layer includes silicon oxide.

According to the aforementioned method of operating the non-volatile memory in one preferred embodiment of the present invention, the non-volatile memory further includes a second dielectric layer disposed between the charge-trapping layer and the gate.

According to the aforementioned method of operating the non-volatile memory in one preferred embodiment of the present invention, the material constituting the second dielectric layer includes silicon oxide.

In the operating method of the present invention, channel initiated secondary hot electron injection is used to perform a programming operation so that the programming voltage and the programming current can be reduced. It also has the abrupt electric field between auxiliary charge region and data storage region. A higher programming efficiency is obtained because of the CHISEL program method and the abrupt electrical field.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
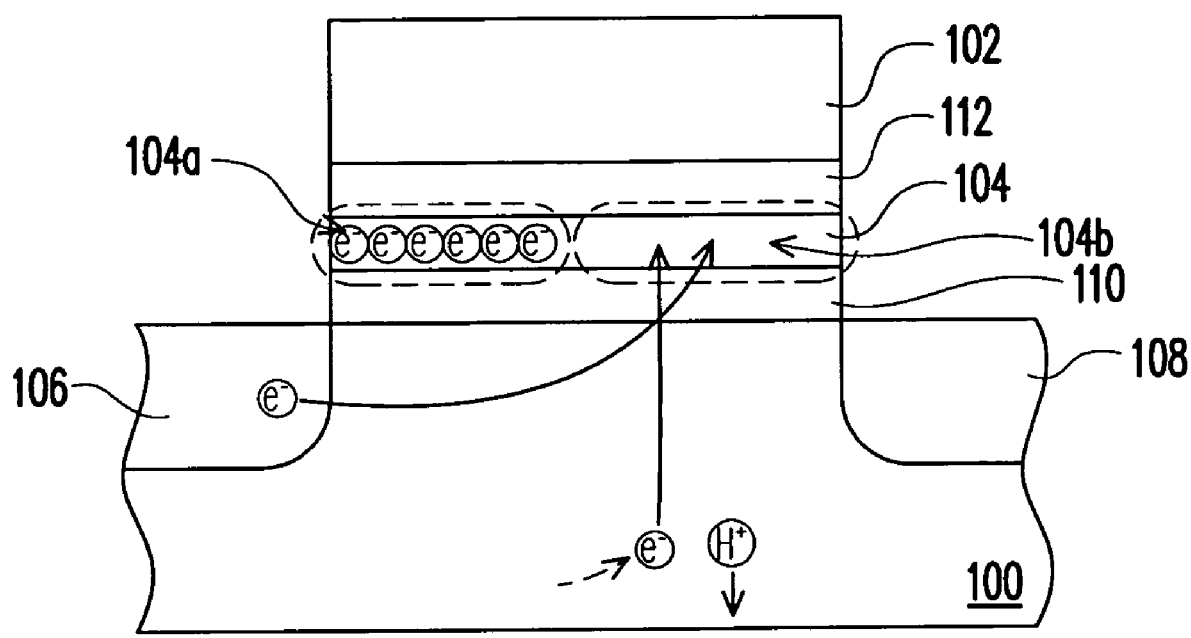
FIG. 1 is a schematic cross-sectional view of a non-volatile memory according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a non-volatile memory according to one embodiment of the present invention. As shown in FIG. 1, the non-volatile memory cell comprises a substrate 100, a gate 102, a charge-trapping layer 104, a source region 106 and a drain region 108. The substrate 100 is a P-type silicon substrate, for example.

The gate 102 is disposed on the substrate 100. The gate 102 is fabricated using doped polysilicon, for example.

The charge-trapping layer 104 is disposed between the gate 102 and the substrate 100. The charge-trapping layer 104 is fabricated using silicon nitride, for example. In addition, the charge-trapping layer 104 can be a composite film layer comprising an insulating layer and a nanometer crystal layer embedded within the insulating layer. The charge-trapping layer 104 close to the source region 106 is an auxiliary charge region 104a while the charge-trapping layer 104 close to the drain region 108 is a data storage region 104b.

The source region 106 is disposed in the substrate 100 on one side of the gate 102 and the drain region 108 is disposed in the substrate 100 on another side of the gate 102. The source region 106 and the drain region 108 are n-doped regions, for example.

In addition, a dielectric layer 110 may be disposed between the substrate 100 and the charge-trapping layer 104 and another dielectric layer 112 may be disposed between the charge-trapping layer 104 and the gate 102. The dielectric layer 110 and the dielectric layer 112 are fabricated using silicon oxide, for example.

In the method of operating a non-volatile memory according to the present invention, electrons are injected into the auxiliary charge region 104a before proceeding with the programming operation. The method of injecting electrons into the auxiliary charge region 104a includes performing a channel hot electron injection, for example. Hence, in an actual programming operation, the voltage applied to the gate 102 will be subjected to the shielding effect by the charges within the auxiliary charge region 104a. As a result, the substrate 100 under the gate 102 can have an abrupt electrical field between auxiliary charge region 104a and data storage region 104b that facilitates the injection of electrons into the data storage region 104b of the charge-trapping layer 104.

To program the non-volatile memory of the present invention, a first voltage is applied to the gate 102, a second voltage is applied to the source 106, a third voltage is applied to the drain region 108 and a fourth voltage is applied to the substrate 100. The first voltage is bigger than the fourth voltage, the third voltage is bigger than the second voltage and the second voltage is bigger than the fourth voltage to initiate a channel initiated secondary hot electron injection (CHISEL). As a result, electrons are injected into the data storage region 104b of the charge-trapping layer 104. The range of first voltage is 2~7V, for example, better performance is 4~5V. The range of second voltage is −2~2V, for example, better performance is about 0V. The range of third voltage is 3~6V, for example, better performance is 4~5V. The range of fourth voltage is 0~−4V, for example, better performance −1~−2V.

In the aforementioned programming operation, the channel hot electrons generated from the source region 106 will produce electron-hole piles in the substrate 100 through bombardment. Because the fourth voltage applied to the substrate 100 is smaller than the first voltage applied to the gate 102, the electric field thus produced will drive the holes to flow in the direction of the electrode potential set up in the substrate 100. Consequently, more electron-hole piles are created through bombardments. The secondary electrons created through the bombardments, subjected to the influence of the electric field, will inject into the charge storage region 104b of the charge-trapping layer 104. Since the present invention utilizes channel initiated secondary hot electron injection effect to perform the programming operation, and the memory cell also has abrupt electrical field between auxiliary charge region, the programming voltage and current can be reduced significantly and the programming efficiency is increased.

In summary, the major advantages of the present invention at least includes:

1. The method of programming the non-volatile memory according to the present invention can reduce programming voltage and programming current, so that a higher programming efficiency is obtained.
2. In the method of operating the non-volatile memory of the present invention, electrons have been injected into the auxiliary charge region prior to performing the programming operation. Hence, an abrupt electric field is set up within the substrate to facilitate the injection of electrons into the charge storage region and improve programming efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a non-volatile memory comprising a gate on a substrate, a charge-trapping layer disposed between the gate and the substrate, a source region disposed in the substrate on one side of the gate, a drain region disposed in the substrate on the other side of gate, wherein the charge-trapping layer has an auxiliary charge region close to the source region and the charge-trapping layer has a data storage region close to the drain region, and electrons are injected into to the auxiliary charge region prior to performing the operation, the operating method includes:

performing a programming operation by applying a first voltage to the gate, applying a second voltage to the source region, applying a third voltage to the drain region and applying a fourth voltage to the substrate, wherein the first voltage is bigger than the fourth voltage, the third voltage is bigger than the second voltage, the second voltage is bigger than the fourth voltage to produce a channel initiated secondary hot electron injection (CHISEL) effect so that electrons are injected into the data storage region, and the first voltage applied to the gate is subjected to an shielding effect by the electrons within the auxiliary charge region to cause an abrupt electrical field in the substrate under the gate between auxiliary charge region and the data storage region.

2. The operating method of claim 1, wherein the first voltage is between 2~7V.

3. The operating method of claim 2, wherein the first voltage is between 4~5V.

4. The operating method of claim 1, wherein the second voltage is between −2~2V.

5. The operating method of claim 4, wherein the second voltage is about 0V.

6. The operating method of claim 1, wherein the third voltage is between 3~6V.

7. The operating method of claim 6, wherein the third voltage is between 4~5V.

8. The operating method of claim 1, wherein the fourth voltage is between 0~−4V.

9. The operating method of claim 8, wherein the fourth voltage is between −1~−2V.

10. The operating method of claim 1, wherein the material constituting the charge-trapping layer includes silicon nitride.

11. The operating method of claim 1, wherein the charge-trapping layer further includes a composite film layer comprising an insulating layer and a nanometer crystal layer embedded within the insulating layer.

12. The operating method of claim 1, wherein the non-volatile memory further includes a first dielectric layer disposed between the substrate and the charge-trapping layer.

13. The operating method of claim 12, wherein the material constituting the first dielectric layer includes silicon oxide.

14. The operating method of claim 1, wherein the non-volatile memory further includes a second dielectric layer disposed between the charge-trapping layer and the gate.

15. The operating method of claim 14, wherein the material constituting the second dielectric layer includes silicon oxide.

* * * * *